(12) United States Patent
Mitra et al.

(10) Patent No.: US 9,209,259 B2
(45) Date of Patent: Dec. 8, 2015

(54) CUSTOMIZED SHIELD PLATE FOR A FIELD EFFECT TRANSISTOR

(71) Applicant: Freescale Semiconductor, Inc., Austin, TX (US)

(72) Inventors: Agni Mitra, Gilbert, AZ (US); David C. Burdeaux, Tempe, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/196,611

(22) Filed: Mar. 4, 2014

(65) Prior Publication Data

US 2014/0187012 A1 Jul. 3, 2014

Related U.S. Application Data

(62) Division of application No. 13/324,910, filed on Dec. 13, 2011, now Pat. No. 8,680,615.

(51) Int. Cl.
| | |
|---|---|
| *H01L 21/76* | (2006.01) |
| *H01L 29/40* | (2006.01) |
| *H01L 29/66* | (2006.01) |
| *H01L 29/78* | (2006.01) |
| H01L 29/417 | (2006.01) |
| H01L 29/06 | (2006.01) |

(52) U.S. Cl.
CPC ........ *H01L 29/402* (2013.01); *H01L 29/66719* (2013.01); *H01L 29/7835* (2013.01); *H01L 29/0692* (2013.01); *H01L 29/404* (2013.01); *H01L 29/4175* (2013.01)

(58) Field of Classification Search
CPC ............... H01L 21/823481; H01L 27/088; H01L 29/0653; H01L 29/0847; H01L 29/1066; H01L 29/402; H01L 29/407; H01L 29/4933; H01L 29/7801; H01L 29/7811; H01L 29/7816; H01L 29/7817; H01L 29/7823; H01L 29/7831
USPC ......... 438/304, 404, 405, 454, 584–588, 595, 438/618, 621, 669, 682, 761, 763, 778, 438/FOR. 163, FOR. 167, FOR. 168, 438/FOR. 210, FOR. 349, FOR. 355, 438/FOR. 428
See application file for complete search history.

(56) References Cited

U.S. PATENT DOCUMENTS

| | | | |
|---|---|---|---|
| 6,107,160 A | * | 8/2000 | Hebert et al. ................. 438/454 |
| 6,717,214 B2 | | 4/2004 | Pettruzello et al. |
| 6,794,719 B2 | | 9/2004 | Petruzzello et al. |
| 6,833,726 B2 | | 12/2004 | Petruzzello et al. |

(Continued)

*Primary Examiner* — Kyoung Lee
*Assistant Examiner* — Joannie A Garcia

(57) ABSTRACT

A customized shield plate field effect transistor (FET) includes a semiconductor layer, a gate dielectric, a gate electrode, and at least one customized shield plate. The shield plate includes a conductive layer overlying a portion of the gate electrode, one of the gate electrode sidewalls, and a portion of the substrate adjacent to the sidewall. The shield plate defines a customized shield plate edge at its lateral boundary. A distance between the customized shield plate edge and the sidewall of the gate electrode varies along a length of the sidewall. The customized shield plate edge may form triangular, curved, and other shaped shield plate elements. The configuration of the customized shield plate edge may reduce the area of the resulting capacitor and thereby achieve lower parasitic capacitance associated with the FET. The FET may be implemented as a lateral diffused MOS (LDMOS) transistor suitable for high power radio frequency applications.

17 Claims, 3 Drawing Sheets

(56) References Cited

U.S. PATENT DOCUMENTS

| | | |
|---|---|---|
| 7,307,314 B2 | 12/2007 | Babcock et al. |
| 7,368,668 B2 | 5/2008 | Ren et al. |
| 7,420,247 B2 | 9/2008 | Xu et al. |
| 7,521,768 B2 | 4/2009 | Theeuwen et al. |
| 7,576,388 B1 | 8/2009 | Wilson et al. |
| 7,582,533 B2 | 9/2009 | Ko |
| 7,986,186 B2 | 7/2011 | Marbell et al. |
| 8,008,719 B2 | 8/2011 | Davies |
| 8,063,446 B2 | 11/2011 | Ko |
| 2003/0001209 A1 | 1/2003 | John et al. |
| 2003/0218211 A1 | 11/2003 | John et al. |
| 2004/0021175 A1 | 2/2004 | Brech |
| 2004/0164351 A1 | 8/2004 | Petruzzello et al. |
| 2004/0232510 A1 | 11/2004 | Petruzzello et al. |
| 2005/0280080 A1 | 12/2005 | Babcock et al. |
| 2005/0280085 A1 | 12/2005 | Babcock et al. |
| 2005/0280087 A1 | 12/2005 | Babcock et al. |
| 2006/0081836 A1 | 4/2006 | Kimura |
| 2007/0007591 A1 | 1/2007 | Theeuwen et al. |
| 2007/0034942 A1 | 2/2007 | Xu et al. |
| 2007/0069308 A1 | 3/2007 | Ko |
| 2007/0181339 A1 | 8/2007 | Ren et al. |
| 2009/0218622 A1 | 9/2009 | Rijs et al. |
| 2009/0273026 A1 | 11/2009 | Wilson et al. |
| 2009/0273032 A1 | 11/2009 | Ko |
| 2010/0085120 A1 | 4/2010 | Marbell et al. |
| 2010/0155837 A1* | 6/2010 | Hebert .................... 257/334 |
| 2011/0266620 A1 | 11/2011 | Terrill |
| 2011/0303976 A1 | 12/2011 | Kocon et al. |

\* cited by examiner

CUSTOMIZED SHIELD PLATE FOR A FIELD EFFECT TRANSISTOR

The present patent application is a divisional of a previously filed patent application, U.S. patent application Ser. No. 13/324,910, filed Dec. 13, 2011, the entirety of which is hereby incorporated by reference. Pursuant to 37 CFR §1.78 (a)(3), an application data sheet containing a reference to the previously filed application, unless submitted previously, is submitted contemporaneously herewith.

BACKGROUND

1. Field of Disclosure

The disclosed subject matter is in the field of semiconductor devices and, more particularly, field effect transistors.

2. Related Art

Shield plates have been used in conjunction with field effect transistors to control or modify electrical fields that the transistors generate during operation. The values of parasitic elements associated with conventional shield plates were largely determined by fabrication process parameters. While designers could specify how far a shield plate extended beyond the gate electrode sidewall parallel to the surface region of the underlying substrate, this parameter was subject to a minimum below which the structure would lose its effectiveness as a shield plate. Thus, designers were constrained in their ability to reduce the parasitic capacitance associated with a shield plate.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
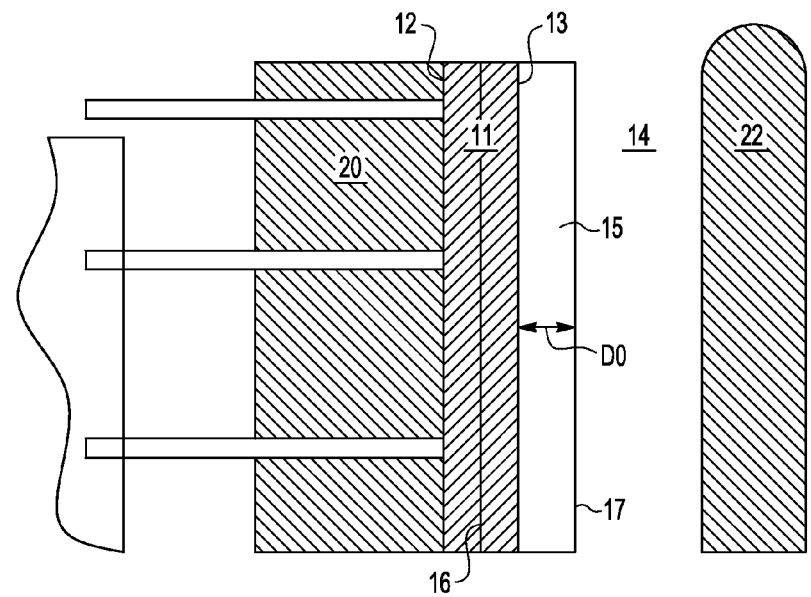
FIG. 1 is a layout of a transistor employing a conventional field plate according to the prior art.

Referring to FIG. 1, a layout view of selected elements of a transistor 10 is depicted. As depicted in FIG. 1, transistor 10 includes a gate electrode 11 positioned between a source region 20 and a drift region 14. Drift region 14 extends from gate electrode 11 to a drain region 22. Gate electrode 11 includes a first sidewall 12 proximal to source region 20 and a second sidewall 13 proximal to drain region 22. Transistor 10 includes a Faraday shield plate, identified as shield plate 15, used to improve control of electrical fields and achieve higher breakdown voltage. Shield plate 15 overlies second sidewall 13 and extends from a first boundary 16 overlying gate electrode 11 to a second boundary 17 overlying drift region 14. In the configuration depicted in FIG. 1, second boundary 17 of shield plate 15 is substantially parallel to second sidewall 13 of gate electrode 11, with a displacement D0 between gate electrode second sidewall 13 and shield plate second boundary 17.

The configuration of shield plate 15 as depicted in FIG. 1 results in a capacitive structure that affects the operation of transistor 10. Moreover, the value or magnitude of the capacitor is, at least to some extent, predetermined by the fabrication process, which dictates, for example, the vertical displacement between shield plate 15 and the underlying drain region 14. Disclosed below is a shield plate configuration that permits a degree of control over the electrical characteristics of the shield plate.

In one embodiment, disclosed subject matter describes a semiconductor device that includes a plurality of transistors fabricated or otherwise included in a packaged semiconductor die. The transistors include at least one transistor referred to herein as a customized shield plate field effect transistor (FET). The customized shield plate FET includes a semiconductor layer, a gate dielectric, a gate electrode, an interlevel dielectric (ILD) referred as a shield ILD, and at least one shield plate referred to herein as a customized shield plate. The semiconductor layer may be an epitaxial layer formed on a semiconductor substrate. The semiconductor layer includes a surface layer, extending from an upper surface of the semiconductor layer to a predetermined depth, that represents a region in which source and drain regions of the FET are formed.

The gate dielectric may be a thermally formed silicon oxide, another material having a suitable high dielectric constant, or a combination thereof. The gate electrode includes a first sidewall and a second sidewall that define lateral boundaries of a channel region of the surface layer underlying the gate electrode. The channel region is laterally displaced within the surface layer between a source region and a drain region of the surface layer. The gate electrode may be a doped polysilicon, another sufficiently conductive material including a silicide material, or a combination thereof.

The shield ILD includes a shield portion overlying at least a portion of an upper surface of the gate electrode, the sidewall, referred to herein as the d-sidewall, of the gate electrode proximal to the drain region, and a portion of the drain region. The customized shield plate includes a conductive film, such as a metal, silicide, or other suitable material, overlying the shield portion of the shield ILD. The shield plate defines or includes an edge, referred to herein as a customized shield plate edge, that overlies the drain region of the surface layer in the semiconductor substrate.

The shield plate edge may be configured so that a distance between the shield plate edge and the d-sidewall of the gate electrode varies along a length of the d-sidewall. The variation in distance may be achieved by fabricating the shield plate edge as a series of line segments forming triangular elements or elements of other shapes. In other configurations, the shield plate edge may include semicircular or other curved-edge elements. The configuration of the shield plate edge may be designed to achieve a desired value of a parasitic capacitance or other parasitic element or characteristic of the FET. The shield plate edge might, for example, be configured to reduce the total area of the shield plate and thereby reduce the parasitic capacitance of the shield plate. Any reduction in capacitance cannot, however, be accompanied by a reduction in the device's performance or reliability.

The customized shield plate FET may be implemented as a lateral diffused metal oxide semiconductor (LDMOS) transistor. The customized shield plate FET may include two or more shield plate structures, separated by intervening shield plate ILDs. When multiple shield plates are employed, one or more of the shield plates may include a customized shield plate edge. The spacings between shield plates may vary and the distances between the d-sidewall and each of the modulate edges may be different for each shield plate.

In another aspect, disclosed subject matter describes a transistor that includes an epitaxial layer overlying a semiconductor substrate. The epitaxial layer includes a surface layer extending from an upper surface of the epitaxial layer to a predetermined surface depth. A gate dielectric overlies a channel region of the surface layer. A gate electrode overlying the gate dielectric includes an s-sidewall and a d-sidewall defining boundaries of a surface layer channel region underlying the gate electrode. The channel region lies between a first high voltage region and a second high voltage region of the surface layer. A source region includes a portion of the surface region extending between the first high voltage region and a source contact region. The second high voltage region includes a portion of the surface region extending between the first high voltage region and the drain region.

The transistor further includes a shield ILD. The shield ILD includes a shield portion overlying at least a portion of an upper surface of the gate electrode, the d-sidewall, and a portion of the second high voltage region. The shield plate includes an electrically conductive film overlying the shield portion of the shield ILD. The shield plate defines a shield plate edge overlying the second high voltage region. The shield plate edge may be configured as a customized shield plate edge in which a displacement between the customized shield plate edge and the d-sidewall varies along a length of the d-sidewall.

The transistor may further include a second shield ILD including a shield portion overlying at least a portion of the upper surface of the gate electrode, the d-sidewall, and a portion of the second high voltage region and a second shield plate. The second shield plate includes an electrically conductive film overlying the shield portion of the second shield ILD. The second shield plate defines a second shield plate edge overlying a second shield ILD. The second shield plate edge may define a second customized shield plate edge overlying the second high voltage region. In these embodiments, a displacement between the second shield plate edge and the d-sidewall varies along a length of the d-sidewall. In some embodiments, the second shield plate defines a parallel shield plate edge in which a displacement between the second shield plate edge and the d-sidewall remains substantially constant along a length of the d-sidewall.

In embodiments where one shield plate is a customized shield plate and a second shield plate is not, the second shield plate may overlie the first shield plate or vice versa. A displacement between the first shield plate edge and the d-sidewall may exceed a displacement between the second shield plate edge and the d-sidewall along a first portion of the first shield plate edge. In a different embodiment, the displacement between the first shield plate edge and the d-sidewall may be less than a displacement between the second shield plate edge and the d-sidewall along a second portion of the first shield plate edge. In still another embodiment, the displacement between the first shield plate edge and the d-sidewall may exceed a displacement between the second shield plate edge and the d-sidewall along a first portion of the first shield plate edge and may be less than a displacement between the second shield plate edge and the d-sidewall along a second portion of the first shield plate edge.

In transistors employing multiple shield plates, a thickness of the first shield plate ILD may differ from a thickness of the second shield plate ILD. Similarly, a thickness of the first shield plate may differ from a thickness of the second shield plate and the material of the first shield plate field may be different than the shield plate material of the second shield plate. The shield plate material(s) may be doped polysilicon, metal-silicide including tungsten-slice, a metal such as aluminum, copper or any other material or combination of materials that exhibits a desirable electrical conductivity that is suitable for use in the fabrication processor.

The first shield plate edge may include a plurality of straight line segments, curved segments, or both. The straight line segments, when employed, may define triangular-shaped elements of the shield plate while the curved line segments may define semi-circular and other curved elements of the shield plate.

In some embodiments, the customized shield plate edge represents an aspect of the shield plate under the control of a circuit a device fabrication that may be employed and manipulated to achieve or provide desirable values of one or more parameters or characteristics. The configuration of the customized edge may be designed, as an example, to achieve a reduction in a parasitic capacitance associated with the transistor.

In a third aspect, disclosed subject matter describes a semiconductor fabrication process suitable for providing shield plates having customized edges for one or more FETs. In this aspect, the process includes depositing a shield plate ILD on a semiconductor wafer. The semiconductor wafer may be a semiconductor wafer that has been previously processed according to any number of processes for fabrication of LDMOS transistors or other suitable types of transistors. According to the described process, the semiconductor wafer includes a gate electrode overlying a gate dielectric that, itself, overlies a semiconductor substrate. The semiconductor substrate may include a channel region underlying the gate electrode laterally positioned between a drain region and a source region.

A shield plate film is deposited or otherwise formed overlying the shield plate ILD and etched or otherwise patterned to form a customized shield plate. The customized shield plate, again, overlies a portion of the gate electrode and a portion of a drain region of the semiconductor substrate. The customized shield plate is patterned using a shield plate mask that defines a customized edge. The customized edge is characterized as being non-parallel with a sidewall of the gate electrode nearest the drain. In this configuration, a distance between the customized edge and the drain-side sidewall of the gate electrode varies along a length of the customized edge. The fabrication process may include formation of additional shield plate structures by fabricating one or more additional shield plate ILDs and one or more corresponding shield plate films.

As used herein, doping concentration designations such as heavily doped (P+ or N+), moderately doped (P or N) and lightly doped (P− or N−) may refer to the following exemplary doping concentrations: N+ or P+ ($>5E^{19}$ cm$^{-3}$), N− or P− ($<5E^{16}$ cm$^{-3}$), and N or P (in between).

Figure 2:
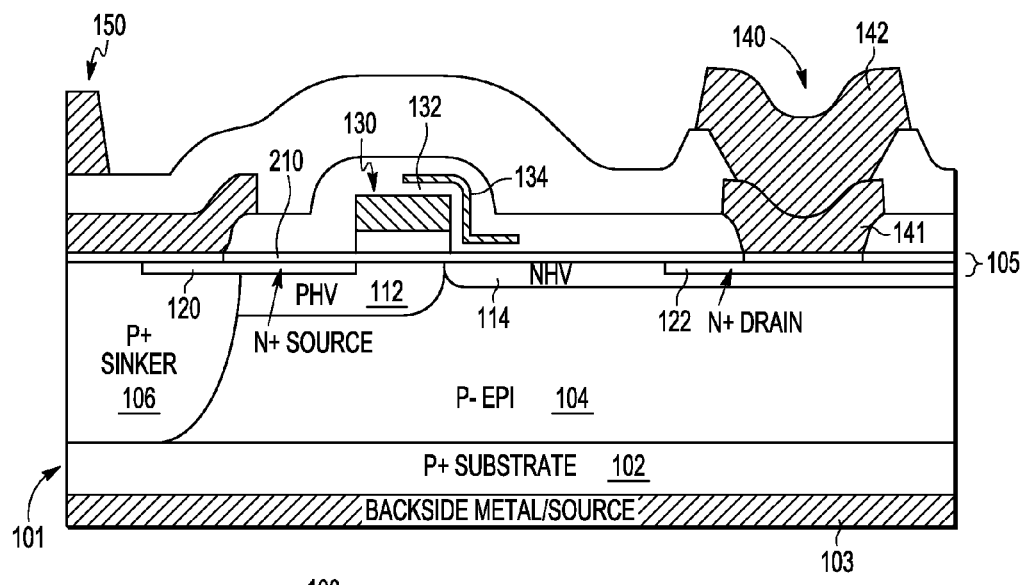
FIG. 2 is a cross section illustrating selected elements of a field effect transistor including a customized shield plate.
Figure 3:
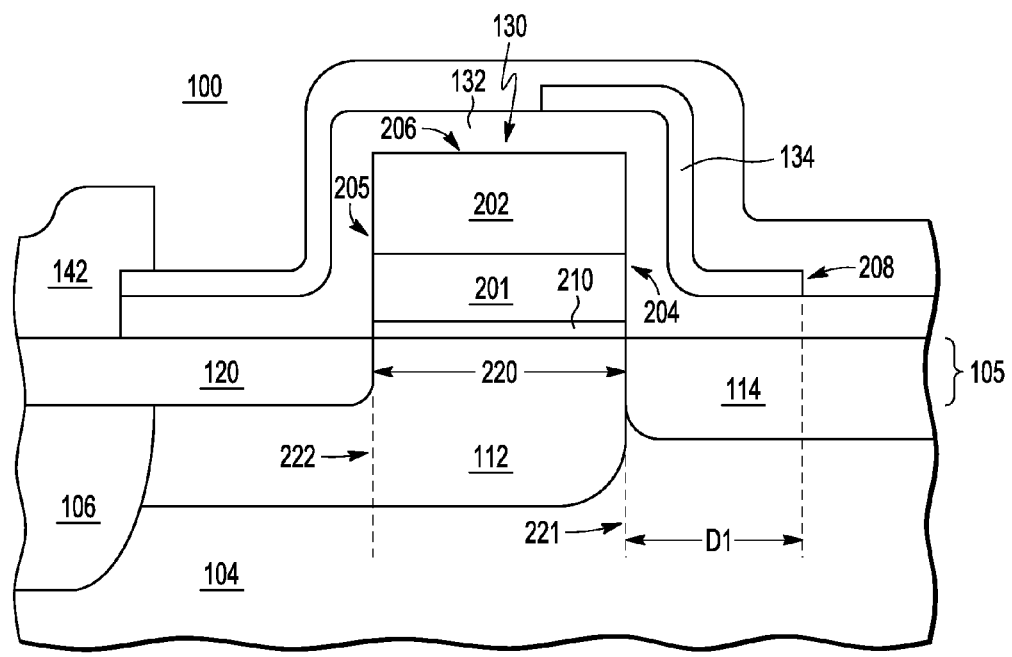
FIG. 3 depicts additional detail of a portion of the transistor of FIG. 2.

Turning now to the drawings, FIG. 2 is a cross sectional view illustrating selected elements of a field effect transistor (FET) 100. FIG. 3 illustrates greater detail of a portion of FIG. 2. As depicted in FIG. 2 and FIG. 3, FET 100 is implemented as a lateral diffused metal oxide semiconductor (LDMOS) transistor suitable for use in a radio frequency (RF) power amplification application, such as a wireless base station power amplifier, requiring low cost, high gain, and highly linear device characteristics. FIG. 2 and FIG. 3 depict a single "finger" of an LDMOS transistor. The depicted LDMOS transistor is a three terminal, n-channel, enhancement-mode FET having a single gate electrode 130, a uniformly thick gate dielectric 210, and source and drain regions 120, 122 that are asymmetrically displaced on either side of a channel region 220 underlying gate electrode 130. In other embodiments (not depicted), however, FET 100 may be a p-channel device, have a positive or negative threshold voltage, have multiple gate electrodes including floating gate electrodes, employ two or more thicknesses or materials of gate dielectric and material, or include symmetrically arranged source/drain regions. In addition, while the embodiments of FET 100 described herein may include or exhibit specific materials, dimensions, and electrical characteristics, material selection and specific dimensions are implementation specific details that may vary depending upon the embodiment unless expressly described otherwise and alternative materials and dimensions may be employed where appropriate.

Before setting forth specific implementation details of FET 100, selected features of FET 100 are described. In some embodiments, gate electrode 130 may include a silicide structure to reduce gate access resistance, which may be significant in applications such as RF power devices where relatively large geometries may be employed. Gate electrode 130 and drain region 122 may be specifically configured to emphasize various electrical and operational parameters thought to be significant for RF power transistors. Examples of the parameters emphasized in some configurations of FET 100 include, without limitation, relatively high breakdown voltage, relatively low on-state resistance (RDSon), and relatively high hot carrier injection (HCI) reliability.

The depicted embodiment of FET 100 employs a stacked drain metal structure 140 configured to exhibit desirable eletromigration characteristics to achieve high reliability. In the depicted embodiment, stacked drain metal structure 140 includes a second metal structure 142 overlying a first metal structure 141. Some embodiments of FET 100 include a second metal gate bus 150 running parallel to an orientation of gate electrode 130, i.e., running perpendicular to the plane of the cross section of FIG. 2. Although not depicted in the cross section of FIG. 2, gate bus 150 may include a plurality of regularly spaced connections to gate electrode 130 to reduce its resistance.

As depicted in FIG. 2 and FIG. 3, FET 100 includes a "sinker" 106 that is electrically connected to source region 120. Sinker 106 as depicted in FIG. 2 also connects to backside metal/source 103 through substrate 102. Sinker 106 beneficially lowers source inductance to improve performance and facilitates direct attachment of a die in which FET 100 is fabricated to an electrically and thermally conductive package flange (not depicted) to support cost efficient packaging platforms.

The depicted embodiment of FET 100 includes a Faraday shield plate 134, sometimes referred to herein as customized shield plate 134. Customized shield plate 134 may be grounded via a ground strap not depicted in FIG. 2. Customized shield plate 134 may be configured to achieve a desirable value of parasitic capacitance between drain region 122 and gate electrode 130. Shield plate 134 may also moderate electric fields occurring in surface region 105 in proximity to a boundary between a channel region 220 and a drift region, referred to herein as N high voltage (NHV) region 114, to improve device performance without sacrificing breakdown voltage or HCl margin. The inclusion of customized shield plate 134 enables a degree of control, at the device level, over parasitics associated with the shield plate. In conventional shield plates, the electrical characteristics of the shield plate and its impact on device performance are, at least to some extent, predetermined by fabrication process parameters for a given layout. While a designer could attempt to reduce capacitance associated with the shield plate by reducing D0 (FIG. 1), D0 is subject to a minimum, below which the effectiveness of the shield plate begins to diminish. The customized shield plate edge employed in the customized shield plate as described below, enables a degree of control over the electrical characteristics of the shield plate without sacrificing the beneficial effects of the shield plate. As an example, the customized shield plate edge may be configured to reduce the area of the shield plate and thereby reduce the parasitic capacitance associated with the shield plate, without compromising reliability and performance characteristics including breakdown voltage, Rdson, HCl reliability, and the source-drain capacitance (Cds).

The depicted embodiment of FET 100 includes a semiconductor substrate 102 (FIG. 2). Semiconductor substrate 102 may include crystalline or substantially crystalline silicon doped with a p-type or n-type impurity. In some embodiments, for example, semiconductor substrate 102 is heavily doped with boron or another suitable p-type impurity (P+ silicon). As depicted in FIG. 2, semiconductor substrate 102 is attached to a backside metal/source 103 suitable for attaching to a packaging structure. In the depicted embodiment, source region 120, which is electrically connected to backside metal/source 103 via sinker 106 and substrate 102, may be biased to ground or another voltage via a source electrode (not shown) coupled to a backside metal/source 103 when FET 100 is packaged.

Overlying semiconductor substrate 102, the depicted embodiment of FET 100 includes an epitaxial layer 104. Epitaxial layer 104 is a crystalline or substantially crystalline layer that is grown or deposited on semiconductor substrate 102. The polarities and doping concentrations of semiconductor substrate 102 and epitaxial layer 104 may be independently controlled during fabrication. In n-channel embodiments of FET 100, epitaxial layer 104 may be lightly doped (P−) with boron or another p-type impurity layer while semiconductor substrate 102 may be a heavily doped (P+) with the same p-type impurity or a different p-type impurity. In embodiments designed for achieving a relatively high breakdown voltage, a thickness or depth of epitaxial layer 104 may be relatively high, in the range of approximately 5 to approximately 8 μm.

In the depicted implementation of FET 100, a p-type high voltage (PHV) region 112 extends from sinker 106 to a drain-side boundary 221 of channel region 220. Channel region 220 includes a portion of upper surface 105 underlying gate electrode 130 and gate dielectric 210 and is defined by or aligned to d-sidewall 204 of gate electrode 130 on a drain side boundary 221 and defined by or aligned to s-sidewall 205 of gate electrode 130 on the source side boundary 222. The doping concentration and configuration of PHV region 112 influences the threshold voltage and other turn on characteristics of FET 100 as is well known in the field of MOS device electronics. In n-channel enhancement mode devices, PHV region 112 is a p-doped region with a low to moderate (P− to P doping concentration).

In the embodiment depicted in FIG. 2 and FIG. 3, PHV 112 and source region 120 are shorted to sinker 106 and substrate 102. The short between PHV 112 and source region 120 defines a path for avalanche current generated when the magnitude of the electric field at the pn-junction between drain region 122 and epitaxial layer 104 is sufficient to generate minority carriers by impact ionization.

The depicted embodiment of FET 100 includes an n-type drift region, referred to herein as n-type high voltage (NHV) region 114 located in surface region 105 of wafer 101 laterally disposed between PHV 112 and an N+ drain region 122. NHV region 114 may be lightly doped or moderately doped with an n-type impurity such as arsenic or phosphorous. In the depicted embodiment, drain region 122 is laterally displaced from d-sidewall 204 and from drain side boundary 221 of channel region 220, whereas source region 120 is aligned to or defined by s-sidewall 205 and source side boundary 222 of channel region 220. NHV region 114 provides a drift region adjacent to heavily-doped drain region 122 and spaced from heavily doped source region 120. NHV region 114 increases the drain-to-source breakdown voltage of the LDMOS structure 100.

Conductive gate electrode 130 overlies channel region 220 of substrate layer 102. The depicted embodiment of conductive gate electrode 130 includes a lower portion 201 of doped polysilicon layer underlying an upper portion 202 of a silicide, metal, or other conductive material. In some embodiments, the upper portion 202 of gate electrode 130 is a tungsten silicide (WSi). In the depicted embodiment, conductive gate electrode 130 is formed over a gate dielectric layer 210, which may include a thermally formed silicon dioxide, but may include an additional material or an alternate dielectric material. In some embodiments, a thickness of gate dielectric layer 120 may be in a range of approximately 5 nm to approximately 50 nm.

The depicted embodiment of FET 100 includes a shield plate ILD layer 132 overlying source region 120, gate electrode 130, NHV region 114, and drain region 122. In some embodiments, shield plate ILD layer 132 is a substantially conformal layer that forms a relatively uniform thickness layer over s-sidewall 205, upper surface 206 and d-sidewall 204 of gate electrode 130. Shield plate ILD layer 132 may be formed with a conventional chemical vapor deposition process using tetraethyl orthosilicate (TEOS) or another suitable source or a spin on dielectric material. Shield plate ILD layer 132 may be conformally or substantially conformally deposited over the sidewalls 204, 205 and upper surface 206 of gate electrode 130, as well as NHV region 114. A thickness of shield plate ILD layer 132 may be in the range of approximately 100 nm to approximately 1000 nm.

A layer (or plurality of layers) of a conductive material is formed over shield plate ILD layer 132 and patterned to form a customized shield plate 134. Customized shield plate 134 as depicted in FIG. 3 is also a conformal or substantially conformal film that overlies a portion of an upper surface 206 of gate electrode 130, d-sidewall 204, and a portion of NHV region 114. A boundary or edge 208 of shield plate 134 overlying NHV region 114 is referred to herein as customized shield plate edge 208 or, simply, customized shield plate edge 208. Customized shield plate 134 is a conductive film that may by formed of metal, silicide (e.g., WSi), or another suitable material. Patterning of customized shield plate 134 may include conventional photolithography and wet or dry etch processing as appropriate.

FIG. 3 depicts a distance or displacement D1 between customized shield plate edge 208 and d-sidewall 204 of gate electrode 130. A characteristic of customized shield plate edge 208 is that the displacement D1 of customized shield plate edge 208 varies along a length of the edge 208. As depicted in FIG. 3, the length of customized shield plate edge 208 extends perpendicular to the plane of the cross section view of FIG. 3 and the displacement D1 between customized shield plate edge 208 and d-sidewall 204 of gate electrode 130 may vary depending on where along the length of d-sidewall 204 the cross section is taken.

Figure 4:
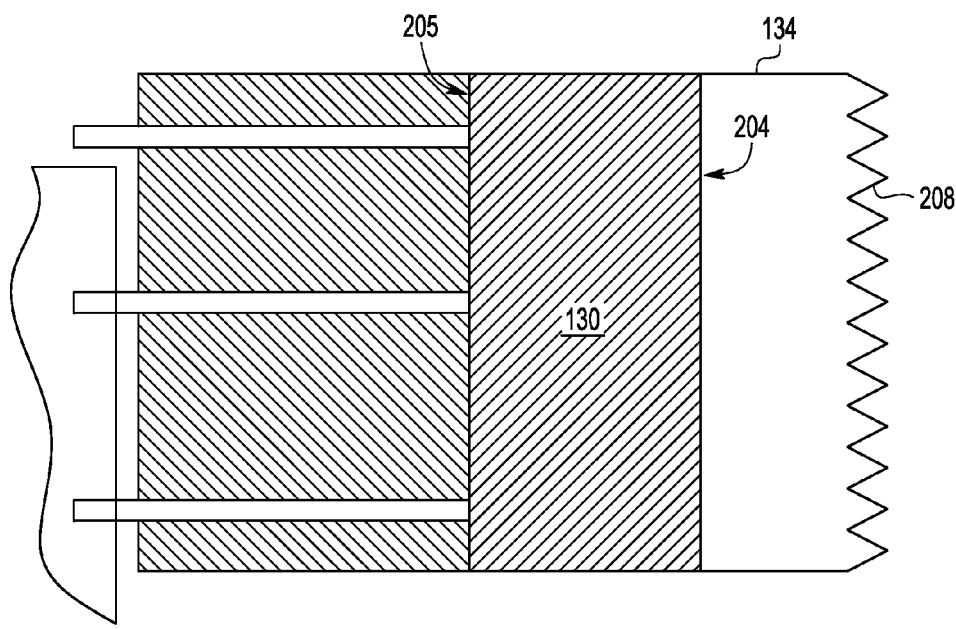
FIG. 4 is a layout view of selected elements of a field effect transistor having a customized shield plate.

Referring to FIG. 4, a layout view of selected elements of FET 100 depicts gate electrode 130 including d-sidewall 204 and s-sidewall 205. Customized gate shield 134 includes a customized shield plate edge 208 that is non-parallel with d-sidewall 204. In the embodiment depicted in FIG. 4, customized shield plate edge 208 includes a series of line segments defining triangular portions of customized shield plate 134. In other embodiments (not depicted), the specific configuration of customized shield plate edge 208 may differ from the triangulated edge depicted in FIG. 4. Without limitation, customized shield plate edge 208 may include semicircular or other curved sections, as well as some sections that are straight and parallel with d-sidewall 204. In these embodiments, customized shield plate edge 208 may include portions that are non-parallel with d-sidewall 204 and portions that are parallel with d-sidewall 204.

The use of customized shield plate 134 beneficially provides circuit designers with some degree of control over the electrical characteristics that the shield plate will have. For example, by enabling designers to configure customized shield plate edge 208 as desired, designers can alter that cross sectional area of the parallel plate capacitor structure that the shield plate forms with the underlying substrate and thereby reduce the parasitic capacitance of the customized shield plate relative to the capacitance of a conventional, straight edge shield plate. Moreover, by permitting designers to incorporate triangular elements and elements of other shapes into the customized edge 108 of customized shield plate 134, device designers may be able to achieve the reduction in capacitance without negatively impacting other devices characteristics that the shield plate affects. For example, by employing a jig saw pattern for customized shield plate edge 208, the area of the parallel plate capacitor formed between customized shield plate 134 and drift region 114 may be decreased, and thereby achieve a reduction in the shield plate parasitic capacitance, while maintaining or improving other device characteristics including breakdown voltage, Rdson, Cds, and the source-drain charge density (Qds), which is the integral of the area under the Cds curve as a function of voltage.

Figure 5:
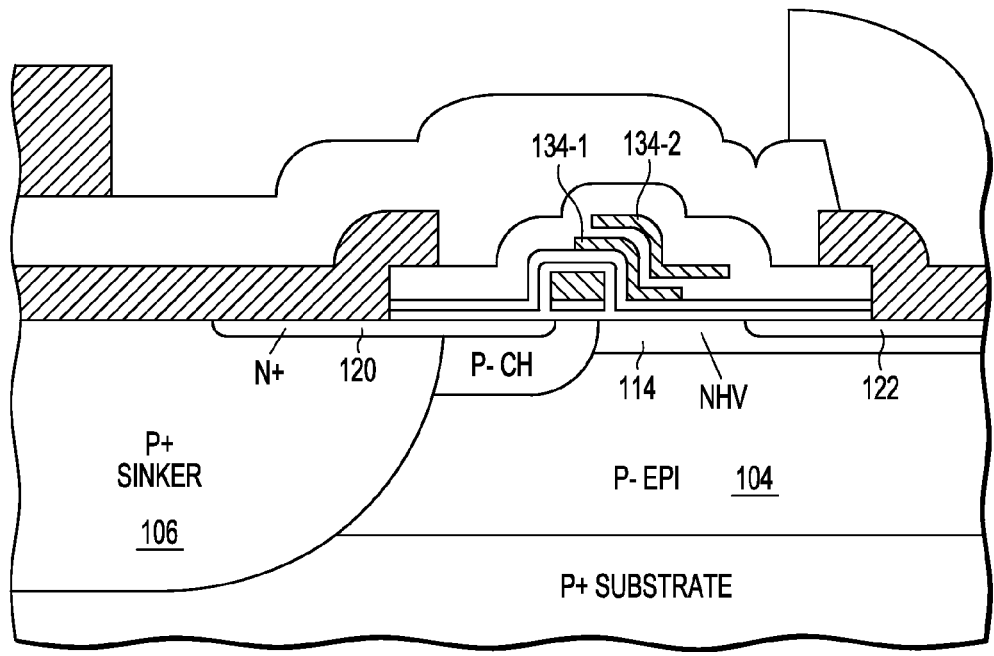
FIG. 5 is a cross section of an implementation employing multiple field plates.
Figure 6:
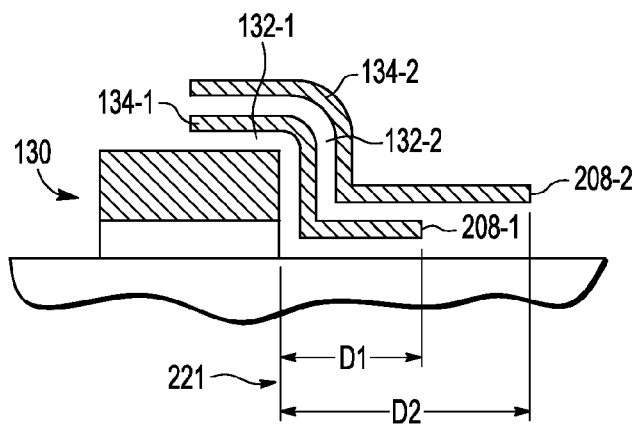
FIG. 6 depicts aspects of the cross section of FIG. 4.

The embodiment of FET 100 depicted in FIG. 2, FIG. 3, and FIG. 4 includes a single shield plate 134. In other embodiments, FET 100 may include two or more shield plates. Referring to FIG. 5 and FIG. 6, an embodiment of FET 100 includes a first shield plate 134-1 and a second shield plate 134-2. First shield plate 134-1 is fabricated over a first shield ILD 132-1 and second shield plate 134-2 is fabricated overlying second shield ILD 132-2, which provides physical and electrical separation between the two shield plates. First shield plate 134-1 has a first edge 208-1 and second shield plate 134-2 has a second edge 208-2, either or both of which may be customized shield plate edges having at least some portions that are non-parallel with d-sidewall 204 of gate electrode 130.

As depicted in FIG. 5 and FIG. 6, first edge 208-1 is displaced by a distance D1 from d-sidewall 204 while second edge 208-2 2 is displaced by a distance D2 from d-sidewall 204. Although D2 is greater than D1 as shown in FIG. 6, in other embodiments D2 may be less than or equal to D1. In addition, because first and second edges 208-1 and 208-2 may both be customized shield plate edges, the relationship between D1 and D2 may vary over the extent of d-sidewall 204 such that D1 may be greater than D2 at some points, less than D2 at other points, and equal to D2 at still other points.

Both of the field plates 134-1 and 134-2 in FIG. 5 and FIG. 6 may be grounded or otherwise biased to a predetermined potential. The field plates may be biased to the same potential as each other or to different potentials. In still other embodiments employing multiple field plates, one or more of the field plates may be floating, i.e., not electrically connected to any other structure and not biased to any potential. The thickness and material of the shield ILDs 132-1 and 132-2 may be differentiated from each other to achieve desired electrical characteristics. Similarly, the thickness and material for the field plates 134-1 and 134-2 may be the same or different. In embodiments that use a silicide such as WSi for field plate 134-1, as an example, field plate 134-2 may be comprised of a first metal material such as aluminum, copper, or another metal or alloy. As depicted in FIG. 5 and FIG. 6, the shield plate edges 208-1 and 208-2 overlie NHV region 114, but may extend further to overlie or partially overlie all of NHV 114 and all or portions of drain region 122.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A semiconductor fabrication process, comprising:
depositing a shield interlevel dielectric (ILD) on a semiconductor wafer, the semiconductor wafer including a gate electrode overlying a gate dielectric overlying a semiconductor substrate, the semiconductor substrate comprising a channel region underlying the gate electrode laterally positioned between a drift region and a source region, the drift region positioned between the channel region and a drain region, wherein the gate electrode comprises a gate electrode of a lateral diffused metal oxide semiconductor transistor;
depositing a shield plate layer overlying the shield ILD;
patterning the shield plate layer to form a customized shield plate, the customized shield plate overlying a portion of the gate electrode and a portion of the drift region, the customized shield plate defining a customized shield plate edge, wherein a distance between the customized shield plate edge and a sidewall of the gate electrode proximal to the drain region varies along a length of the customized shield plate edge;
after patterning the shield plate layer, depositing a second shield plate layer overlying the shield ILD; and
patterning the second shield plate layer to form a second customized shield plate, the second customized shield plate overlying a portion of the gate electrode and a portion of the drift region, the second customized shield plate defining a second customized shield plate edge, wherein a distance between the second customized shield plate edge and the sidewall of the gate electrode proximal to the drain region varies along a length of the second customized shield plate edge.

2. The semiconductor fabrication process of claim 1, wherein the first shield plate is comprised of a first shield plate material and the second shield plate comprises a second shield plate material, wherein the first shield plate material differs from the second shield plate material.

3. A fabrication method, comprising:
obtaining a semiconductor substrate including a surface layer extending from an upper surface of an epitaxial layer to a surface depth;
forming a gate dielectric overlying a channel region of the surface layer;
forming a gate electrode overlying the gate dielectric, the gate electrode including a first sidewall and a second sidewall;
forming a channel region comprising a portion of the surface layer underlying the gate electrode;
forming a source region comprising a portion of the surface layer extending between the channel region and a source contact region;
forming a drift region comprising a portion of the surface layer extending between the channel region and a drain region;
forming a shield interlevel dielectric (ILD) overlying at least a portion of an upper surface of the gate electrode, the second sidewall, and a portion the drift region; and
forming a shield plate comprising an electrically conductive layer overlying at least a portion of the shield ILD, the shield plate defining a shield plate edge overlying the drift region, wherein the shield plate edge comprises a customized shield plate edge wherein a displacement between the customized shield plate edge and the second sidewall varies along a length of the second sidewall, and wherein the shield plate comprises a first shield plate, the shield plate edge comprises a first shield plate edge, and the shield ILD comprises a first shield ILD;
forming a second shield ILD including a portion overlying at least a portion of the upper surface of the gate electrode, the second sidewall, and a portion the drift region; and
forming a second shield plate comprising an electrically conductive layer overlying at least a portion of the second shield ILD, the second shield plate defining a second shield plate edge overlying the second shield ILD.

4. The method of claim 3, wherein the second shield plate edge defines a second customized shield plate edge overlying the drift region, wherein a displacement between the second shield plate edge and the second sidewall varies along a length of the second sidewall.

5. The method of claim 3, wherein the second shield plate defines a parallel shield plate edge wherein a displacement between the second shield plate edge and the second sidewall remains substantially constant along a length of the second sidewall.

6. The method of claim 5, wherein the second shield plate overlies the first shield plate.

7. The method of claim 6, wherein the first shield plate overlies the second shield plate.

8. The method of claim 3, wherein the second shield plate overlies the first shield plate.

9. The method of claim 8, wherein the displacement between the first shield plate edge and the second sidewall exceeds a displacement between the second shield plate edge and the second sidewall along a first portion of the first shield plate edge and wherein the displacement between the first shield plate edge and the second sidewall is less than a displacement between the second shield plate edge and the second sidewall along a second portion of the first shield plate edge.

10. The method of claim 3, wherein a thickness of the first shield ILD differs from a thickness of the second shield ILD.

11. The method of claim 3, wherein a thickness of the first shield plate differs from a thickness of the second shield plate.

12. The method of claim 3, wherein the first shield plate is comprised of a first shield plate material and the second shield plate comprises a second shield plate material, wherein the first shield plate material differs from the second shield plate material.

13. The method of claim 3, wherein the shield plate is comprised of a silicide.

14. The method of claim 3, wherein the shield plate edge comprises a plurality of line segments.

15. The method of claim 3, wherein the shield plate edge is configured to achieve a predetermined electrical characteristic of the shield plate.

16. A semiconductor fabrication process, comprising:
forming a shield interlevel dielectric (ILD) overlying at least a portion of an upper surface of a gate electrode, a sidewall of the gate electrode, and a portion a drift region extending between a channel region underlying the gate electrode and a drain region;
forming a shield plate comprising an electrically conductive layer overlying at least a portion of the shield ILD, the shield plate defining a shield plate edge overlying the drift region, wherein the shield plate edge comprises a customized shield plate edge wherein a displacement between the customized shield plate edge and a second sidewall varies along a length of the second sidewall;
forming a second shield ILD overlying at least a portion of the shield plate; and
forming a second shield plate overlying the second shield ILD.

17. The semiconductor fabrication process of claim 16, wherein the shield plate comprises silicide.

* * * * *